(12) United States Patent
Haddy

(10) Patent No.: US 11,510,326 B2
(45) Date of Patent: Nov. 22, 2022

(54) MOBILE DEVICE RETAINER FOR FIELD MAPPING AND DATA COLLECTION

(71) Applicant: UTTO INC., Naples, FL (US)

(72) Inventor: Alan Haddy, Naples, FL (US)

(73) Assignee: UTTO INC., Naples, FL (US)

( * ) Notice: Subject to any disclaimer, the term of this patent is extended or adjusted under 35 U.S.C. 154(b) by 53 days.

(21) Appl. No.: 16/880,702

(22) Filed: May 21, 2020

(65) Prior Publication Data

US 2021/0368635 A1 Nov. 25, 2021

(51) Int. Cl.
*H05K 5/02* (2006.01)
*H05K 7/12* (2006.01)
*H05K 5/03* (2006.01)

(52) U.S. Cl.
CPC ........... *H05K 5/0204* (2013.01); *H05K 5/023* (2013.01); *H05K 5/0239* (2013.01); *H05K 5/03* (2013.01); *H05K 7/12* (2013.01)

(58) Field of Classification Search
CPC .... H05K 5/0204; H05K 5/023; H05K 5/0239; H05K 5/03; H05K 7/12
See application file for complete search history.

(56) References Cited

U.S. PATENT DOCUMENTS 3,672,084 A * 6/1972 Pachmayr ............... F41C 23/10
42/71.02
4,126,290 A * 11/1978 Drouillard ........... H01Q 1/3266
248/231.41
6,091,358 A * 7/2000 Maniscalco ............. G01S 19/41
342/357.57
6,094,625 A * 7/2000 Ralston ................... G06F 3/011
702/150
6,229,893 B1 * 5/2001 Chen ................... B60R 11/0241
379/446
6,522,291 B1 * 2/2003 Noguchi ................ G01S 19/36
342/357.64
6,959,899 B2 * 11/2005 Yeh ...................... F16M 11/041
248/316.4

(Continued)

OTHER PUBLICATIONS

Trimble, Trimble SiteVision YouTube Channel, YouTube, All videos pertinent to the inventive concept of the application, Available at : https://www.youtube.com/channel/UCmo6dALgjf4jy21MHpdhJVQ/videos (Year: 2020).*

(Continued)

*Primary Examiner* — Abhishek M Rathod
*Assistant Examiner* — Keith DePew
(74) *Attorney, Agent, or Firm* — Mark Terry

(57) ABSTRACT

An apparatus for retaining a mobile computing device during data collection and field mapping procedures is disclosed. The apparatus comprises a base element configured to be gripped by a user, a shaft comprising a sliding traction mechanism and a first end, wherein the sliding traction mechanism extends from the first end, a clamping mechanism configured to be affixed to the shaft comprising a second end, wherein the first end and second end cooperate to define an interior space sized for retention of the mobile computing device, and a domed housing configured to house an antenna and a global navigation satellite system (GNSS) processor configured to be communicatively coupled to the mobile computing device.

15 Claims, 6 Drawing Sheets

(56) References Cited

U.S. PATENT DOCUMENTS

| | | | | |
|---|---|---|---|---|
| 7,768,465 | B2* | 8/2010 | Jared | H01Q 1/1214 |
| | | | | 343/713 |
| 8,294,613 | B2* | 10/2012 | Stucki | G01S 19/36 |
| | | | | 342/357.64 |
| 8,373,762 | B2* | 2/2013 | Cottagnoud | G05G 1/06 |
| | | | | 348/211.7 |
| 9,108,096 | B2* | 8/2015 | Solheim | A63B 69/3632 |
| 9,264,599 | B2* | 2/2016 | Reid | F16M 11/00 |
| 9,333,437 | B2* | 5/2016 | DeWitt | A63H 30/04 |
| 9,844,159 | B1* | 12/2017 | Liniger | A45F 5/10 |
| 9,924,005 | B1* | 3/2018 | McElderry | H04M 1/04 |
| 10,172,246 | B2* | 1/2019 | Apter | B60R 11/0258 |
| 10,304,351 | B2* | 5/2019 | Haddy | G01V 3/15 |
| 10,872,466 | B1* | 12/2020 | Hurd | G06T 17/05 |
| 2007/0187659 | A1* | 8/2007 | Wiesemann | H02G 1/085 |
| | | | | 254/134.3 FT |
| 2012/0257345 | A1* | 10/2012 | Hulet | G06F 1/166 |
| | | | | 361/679.32 |
| 2014/0012503 | A1* | 1/2014 | Haddy | G06Q 10/08 |
| | | | | 702/2 |
| 2015/0060618 | A1* | 3/2015 | Solheim | A63B 69/3632 |
| | | | | 248/229.2 |
| 2016/0055357 | A1* | 2/2016 | Hicks | G06K 7/0004 |
| | | | | 235/383 |
| 2017/0323580 | A1* | 11/2017 | Haddy | G01V 3/15 |
| 2017/0359912 | A1* | 12/2017 | Liniger | H02J 7/00 |
| 2018/0132364 | A1* | 5/2018 | Apter | F16B 2/18 |
| 2019/0228374 | A1* | 7/2019 | Hicks | G06K 7/10881 |
| 2021/0378141 | A1* | 12/2021 | Shao | H05K 7/12 |

OTHER PUBLICATIONS

Trimble, Trimble SiteVision: Hardware Setup 2, Dec. 2019, YouTube, Whole video pertinent, Available at: https://www.youtube.com/watch?v=GxwTKG0LBLg (Year: 2019).*

Trimble SiteVision, How Trimble SiteVision Works, Sep. 2019, Trimble, Available at: https://sitevision.trimble.com/blog/how-trimble-sitevision-works-visualizing-data-in-3d/ (Year: 2019).*

Trimble, Trimble SiteVision for Geospatial, Sep. 2019, YouTube, Available at: https://www.youtube.com/watch?v=GyqGXJSIOPU (Year : 2019).*

Trimble, Trimble SiteVision v1.10 User Guide, Jan. 2020, Available at: https://forms.trimble.com/globalTRLTAB.aspx?nav=Collection-128778, Pertinent pages at least as set forth in Office Action accompanying this PTO-892 (Year: 2020).*

* cited by examiner

MOBILE DEVICE RETAINER FOR FIELD MAPPING AND DATA COLLECTION

CROSS-REFERENCE TO RELATED APPLICATIONS

Not applicable.

STATEMENT REGARDING FEDERALLY SPONSORED RESEARCH OR DEVELOPMENT

Not applicable.

INCORPORATION BY REFERENCE OF MATERIAL SUBMITTED ON A COMPACT DISC

Not applicable.

TECHNICAL FIELD

The technical field relates generally to field mapping and data collection for the detection and identification of buried assets (i.e., underground utility lines) and to the use of mobile device retainers for field mapping and data collection related to buried asset location procedures.

BACKGROUND

Utility lines, such as lines for telephones, electricity distribution, natural gas, cable television, fiber optics, Internet, traffic lights, streetlights, storm drains, water mains, and wastewater pipes, are often located underground. Said utility lines described above are referred to as "buried assets" herein. Consequently, before excavation occurs in an area, especially an urban area, an excavator is typically required to clear excavation activities with the proper authorities and service providers. The clearance procedure usually requires that the excavator contact a central authority (such as "One Call", "811" and "Call Before You Dig," which are well known in the art) which, in turn, sends a notification to the appropriate utility companies. Subsequently, each utility company must perform a buried asset detection procedure, which includes having a field technician visit the proposed excavation site, detecting the relevant buried assets and physically marking the position of the buried asset using temporary paint or flags, and potentially storing the data collected in a process referred to as field mapping.

Usually, a field technician visiting a proposed excavation site utilizes a portable electronic device known as a pipe or cable locator, an electromagnetic locate device ("ELD"), an electromagnetic locator, a buried asset locate device, or a buried asset locator (collectively referred to herein as an "ELD"). Said ELDs are commercial, off-the-shelf, devices employed to detect and identify the position of buried assets. The ELD is used to locate an electromagnetic signal radiating from the buried asset, thus enabling the position and route of the buried asset to be marked with paint or flags above surface. The process by which a technician uses tools to detect, identify and mark buried assets is referred to as a buried asset location procedure. The process by which a technician stores the location and attributes of buried assets is referred to as field mapping.

A core feature necessary in order for accurate detection and identification of buried assets is the use of a global navigation satellite system (GNSS). In order to precisely detect, and mark the position of, said buried assets, precise and accurate geographic location data is necessary during the buried asset location procedure. Without said precise and accurate geographic location data, buried assets cannot be detected and marked with sufficient accuracy, which could result in incursion accidents during excavation. Consequently, ELDs utilize highly accurate GNSS subsystems to gather precise and accurate geographic location data during the buried asset location procedure.

With today's availability of mobile computing devices with high processing power, conventional mobile computing devices are starting to be used in connection with buried asset location procedures. The GNSS subsystems on conventional mobile devices, however, are limited in their precision and accuracy. Namely, the GNSS subsystems on conventional mobile devices do not provide the precision and accuracy necessary for high quality buried asset location procedures. Therefore, there is currently a problem associated with the use of conventional mobile computing devices in connection with buried asset location procedures, in that they do not provide adequate geographical location data.

As a result, there exists a need for improvements over the prior art and more particularly, for more efficient systems and methods for detecting and identifying buried assets using conventional mobile computing devices and for field mapping buried assets.

SUMMARY

An apparatus for retaining a mobile computing device during data collection and field mapping procedures is disclosed. This Summary is provided to introduce a selection of disclosed concepts in a simplified form that are further described below in the Detailed Description including the drawings provided. This Summary is not intended to identify key features or essential features of the claimed subject matter. Nor is this Summary intended to be used to limit the claimed subject matter's scope.

In one embodiment, an apparatus for retaining a mobile computing device during data collection and field mapping procedures is disclosed. The apparatus comprises a base element configured to be gripped by a user, a shaft comprising a sliding traction mechanism and a first end, wherein the sliding traction mechanism extends from the first end, a clamping mechanism configured to be affixed to the shaft comprising a second end, wherein the first end and second end cooperate to define an interior space sized for retention of the mobile computing device, and a domed housing configured to house a global navigation satellite system (GNSS) processor configured to be communicatively coupled to the mobile computing device.

In one embodiment, a method for retaining a mobile computing device during data collection and field mapping procedures is disclosed. The method comprises positioning the mobile computing device in an interior space defined by cooperation between a first end associated with a shaft comprising a sliding traction mechanism and a second end associated with a clamping mechanism configured to be affixed to the shaft, applying a retention force associated with the sliding traction mechanism, thereby allowing the mobile computing device to be retained in the interior space, and communicatively coupling the mobile computing device to a global navigation satellite system (GNSS) processor housed in a domed housing configured to be attached to the clamping mechanism.

Additional aspects of the disclosed embodiment will be set forth in part in the description which follows, and in part will be obvious from the description, or may be learned by practice of the disclosed embodiments. The aspects of the disclosed embodiments will be realized and attained by means of the elements and combinations particularly pointed out in the appended claims. It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute part of this specification, illustrate embodiments of the invention and together with the description, serve to explain the principles of the disclosed embodiments. The embodiments illustrated herein are presently preferred, it being understood, however, that the claimed embodiments are not limited to the precise arrangements and instrumentalities shown, wherein:

FIG. 6 is a block diagram depicting an exemplary method for retaining a mobile device during data collection and field mapping procedures, according to an example embodiment; and, FIG. 7 is a block diagram depicting a system including an example computing device and other computing devices;

Like reference numerals refer to like parts throughout the several views of the drawings.

DETAILED DESCRIPTION

Figure 1:
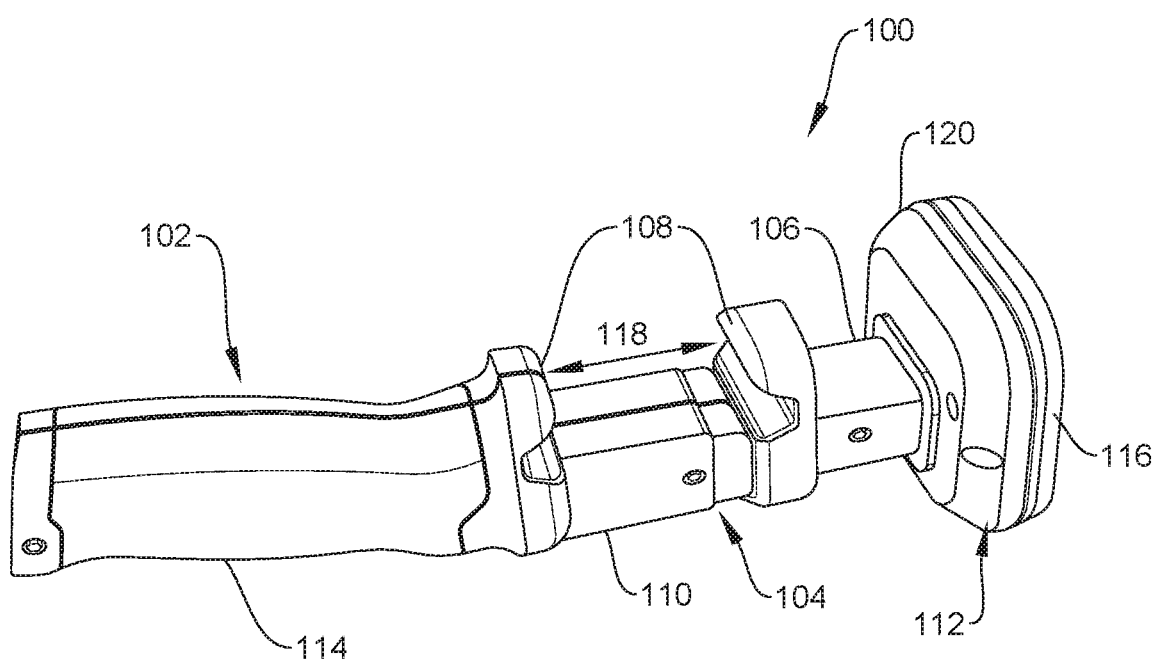
FIG. 1 is a perspective view of an apparatus for retaining a mobile device in an upright horizontal orientation during data collection and field mapping procedures, according to an example embodiment.

The following detailed description refers to the accompanying drawings. Whenever possible, the same reference numbers are used in the drawings and the following description to refer to the same or similar elements. While disclosed embodiments may be described, modifications, adaptations, and other implementations are possible. For example, substitutions, additions or modifications may be made to the elements illustrated in the drawings, and the methods described herein may be modified by substituting reordering, or adding additional stages or components to the disclosed methods and devices. Accordingly, the following detailed description does not limit the disclosed embodiments. Instead, the proper scope of the disclosed embodiments is defined by the appended claims.

The disclosed embodiments improve upon the problems with the prior art by providing an apparatus and method that allows for the use of a conventional mobile computing device during buried asset location procedures, thereby leveraging advanced technologies to detect and identify buried assets. The claimed embodiments improve over the prior art by providing an apparatus configured to retain mobile devices and/or computing devices of various sizes within a space shaped and sized to safely and securely retain the mobile device during buried asset location procedures. Moreover, a domed housing configured to house a GNSS processor is disposed and/or attached to the apparatus assisting communicative coupling of the mobile device to the GNSS processor. Additionally, the disclosed embodiments improve over the prior art by using the GNSS processor to boost or augment a plurality of positioning data associated with the mobile device allowing receiver antennas associated with the mobile device and/or GNSS processor to collect real-time positioning data that may be used during buried asset location procedures.

Figure 2:
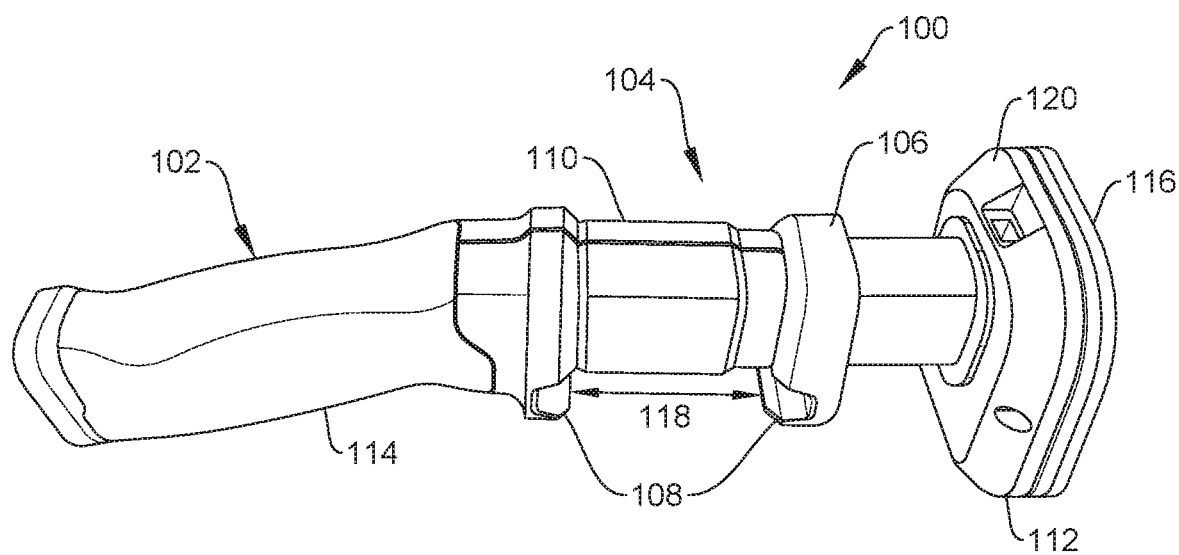
FIG. 2 is a perspective view of an apparatus for retaining a mobile device in an inverted horizontal orientation during data collection and field mapping procedures, according to an example embodiment.

Referring now to the Figures, FIGS. 1 & 2 are a perspective view of an apparatus 100 for retaining a mobile device during data collection and field mapping procedures according to an example embodiment. The apparatus 100 comprises a base element 102, a shaft 104, a clamping mechanism 106, and a domed housing 112. In one embodiment, the components of apparatus 100 may be affixed or detachable to/from each other. Apparatus 100 may be comprised of materials such as galvanized steel or iron, copper, polybutylene, unplasticized polyvinylchloride (PVC), chlorinated polyvinylchloride (CPVC), polyethylene (PE), or any other materials or combination thereof and said materials may be configured to increase corrosion resistance to specific environments, enhance oxidation resistance, and impart special characteristics. It should be appreciated that apparatus 100 can have other shapes, dimensions, and orientations that allow apparatus 100 to efficiently retain mobile devices/computing devices and such variations are within the spirit and scope of the claimed embodiments. In one embodiment, base element 102 further comprises a panel 114 configured to be disposed throughout the surface of base element 102 allowing base element 102 to function as a handle for a user (not shown) to grasp apparatus 100. In one embodiment, panel 114 may comprise a plurality of digit grooves or ridges configured to support grasping by the user with a combination of a palm and digits. Panel 114 may be composed of rubber, polymeric materials, silicone, nitrile, vinyl, neoprene, or any other applicable materials or combination thereof.

In one embodiment, base element 102 is stationary, and shaft 104 projects outwardly from base element 102. Shaft 104 may be adjustable and/or may comprise a sliding traction mechanism 110 configured to support adjusting of the length of shaft 104 and adapt to the length or width of an applicable mobile device and/or computing device being retained by apparatus 100. In one embodiment, shaft 104 and/or sliding traction mechanism 110 may be a plurality of shafts comprising an inner shaft having an inner shaft body, an outer shaft having an outer shaft body configured to house the inner shaft, and a sliding portion configured to assist traversing of the inner shaft into and outside of the outer shaft. This configuration allows for the inner shaft to outwardly project out of the outer shaft body making shaft 104 protrude and extend increasing the overall length of shaft 104 in a stable and secure manner. Sliding traction mechanism 110 is configured to translate through shaft 104 axially. In one embodiment, sliding traction mechanism 110 may include a slide pin or any other applicable mechanism configured to retain and lock a desired length of shaft 104 that may be acquired during inner shaft traversing the outer shaft. In other words, the length of shaft 104 may be locked in a desired position via sliding traction mechanism 110 based on the length required to effectively and securely retain the mobile device. In one embodiment, shaft 104 further comprises at least one first end and sliding traction mechanism 110 is configured to protrude or extend away from the first end.

In one embodiment, clamping mechanism 106 is configured to be affixed to shaft 104 in which sliding traction mechanism 110 may assist the traversal of the inner shaft up until contact with the bottom surface of clamping mechanism 106. In one embodiment, clamping mechanism 106 may further comprise at least one second end in which the first end of shaft 104 and the second end of clamping mechanism 106, referred to collectively as ends 108, cooperate to define an interior space 118 shaped and sized for a computing device. As described herein, a computing device and/or mobile device may include a laptop computer, a tablet computer, a smartphone, wearable technology, a Personal Digital Assistant (PDA), and any other mechanism comprising one or more processors. In one embodiment, ends 108 may each respectively comprise one or more v-grooves or any other retention mechanisms configured to retain an object on polar opposite sides. Ends 108 may further comprise rubber inserts, cushions, or any other applicable insulating mechanism in order to simultaneously retain the computing device securely by coming into direct contact with a surface of the computing device while preventing damage, such as scratches or dents, to the surface of the computing device.

In one embodiment, domed housing 112 is affixed to shaft 104 and/or clamping mechanism 106 and comprises a top lid 116 and a bottom lid 120 in which the top and bottom lids are configured to integrate with each other enclosing a protected internal space configured to house a GNSS antenna 113 and a GNSS system processor 115 or any other applicable components configured to enhance the GNSS capabilities associated with a computing device retained within interior space 118. It should be appreciated that interior space 118 can have other shapes, dimensions, and orientations disposed in any applicable location of apparatus 100 and is not required to be an internal space and such variations are within the spirit and scope of the claimed embodiments. In one embodiment, domed housing 112 may function as a GNSS antennae 113 itself configured to received signals in order to determine position, velocity, timing, and any other components commonly associated with GNSS systems. It should also be appreciated that domed housing 112 can have other shapes, dimensions, and orientations that allow apparatus 100 to efficiently enhance the GNSS system and such variations are within the spirit and scope of the claimed embodiments.

Figure 3:
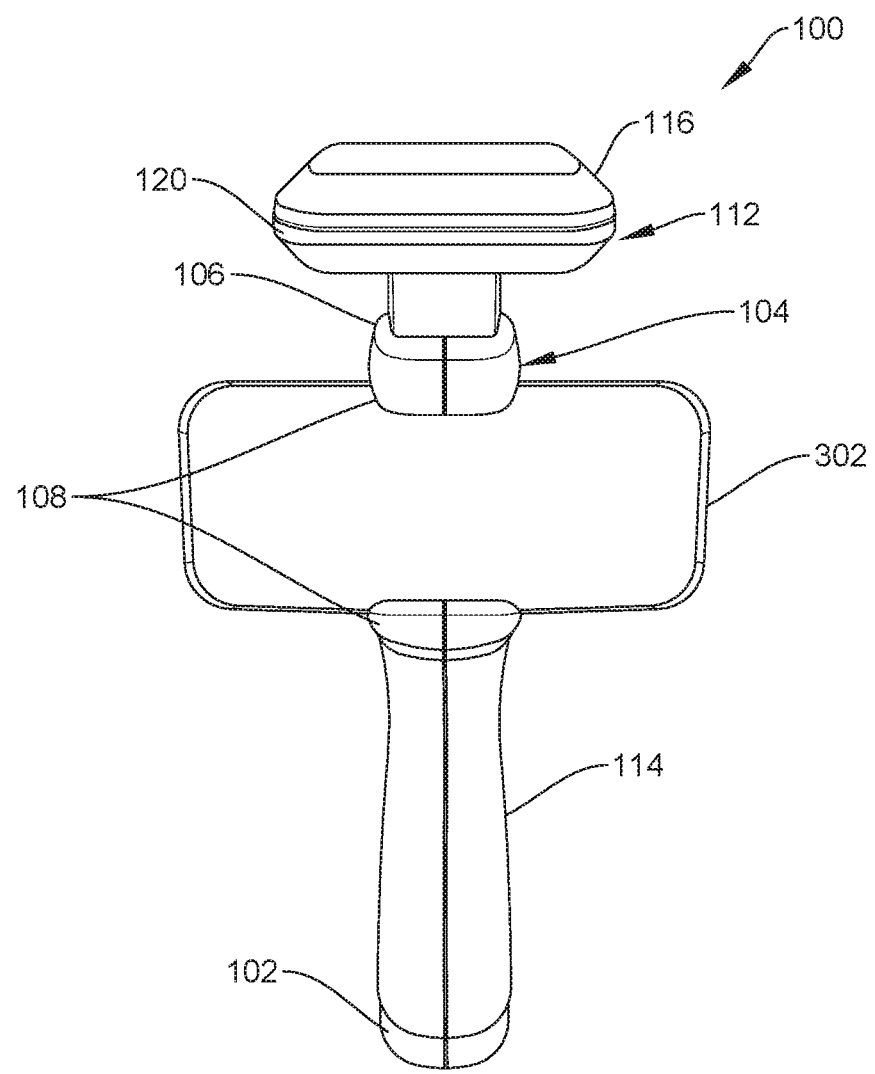
FIG. 3 is a perspective view of an apparatus for retaining a mobile device in an upright vertical orientation during data collection and field mapping procedures, according to an example embodiment.

Referring now to FIG. 3, a perspective view of an apparatus 100 retaining a computing device 302 is depicted. Computing device 302 may be positioned vertically or horizontally between ends 108 allowing computing device 302 to be wedged in interior space 118. In one embodiment, computing device 302 may be communicatively coupled to a GNSS processor retained by domed housing 112 via Bluetooth®, infrared, Zigbee, or any other applicable wireless technologies configured to interact with a computing device. Communicative coupling between computing device 302 and the GNSS processor allows the GNSS associated with computing device 302 to be enhanced via improved functionalities, such as repeaters, amplification, retransmission, or any other applicable GNSS components known in the art. For example, the improved functionalities enhance the identification and positioning data acquired by computing device 302 in combination with the GNSS processor compared to the identification and positioning data acquired by computing device 302 itself due to limitations associated with detecting mains deeper beneath the surface that otherwise would not be detected due to the limited range of GNSS receivers associated with mobile devices. In application, once computing device 302 is securely retained in interior space 118 formed by ends 108 and computing device 302 has an established successful pairing/connection with the GNSS processor, the user may carry apparatus 100 via base element 102 and peruse the excavation site allowing GNSS functionalities to operate effectively resulting in topological maps of the excavation site being generated, based on collected positioning data, reflecting the identity and position of mains beneath the surface.

Figure 4:
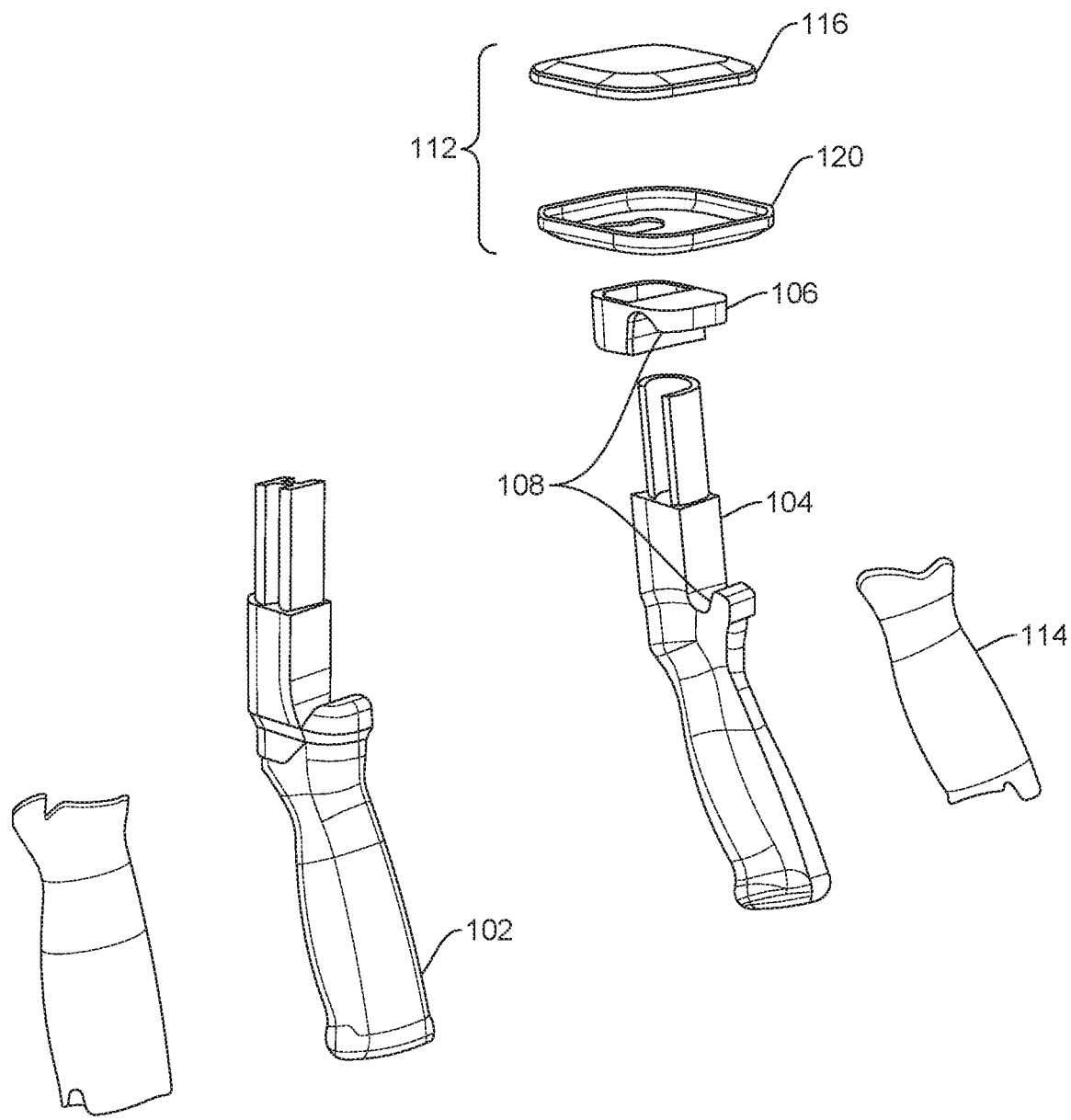
FIG. 4 is an exploded view of the apparatus for retaining a mobile device during data collection and field mapping procedures, according to an example embodiment.
Figure 5A:
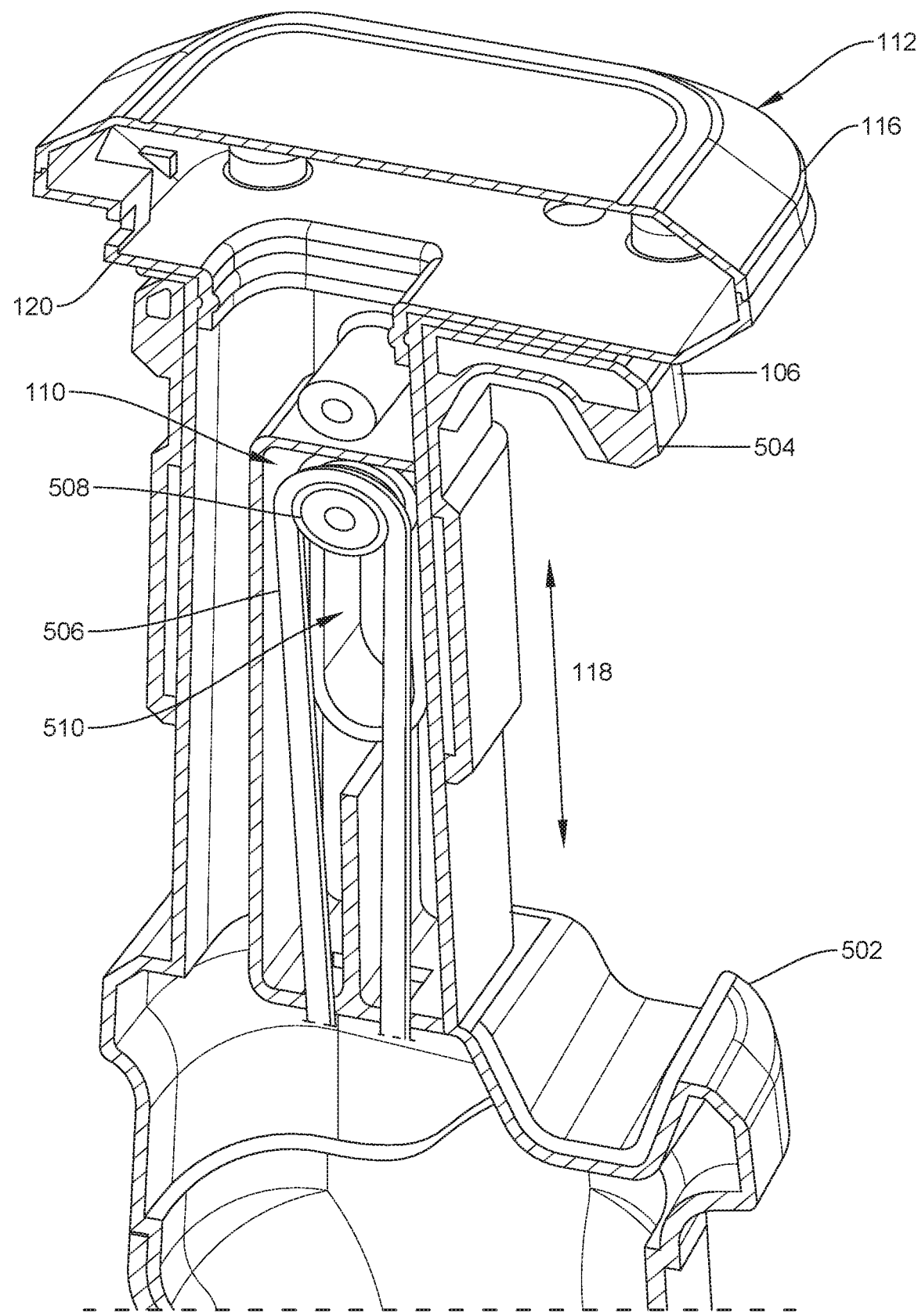
FIGS. 5A-B are cross-sectional views of the apparatus for retaining a mobile device during data collection and field mapping procedures, according to an example embodiment.
Figure 5B:
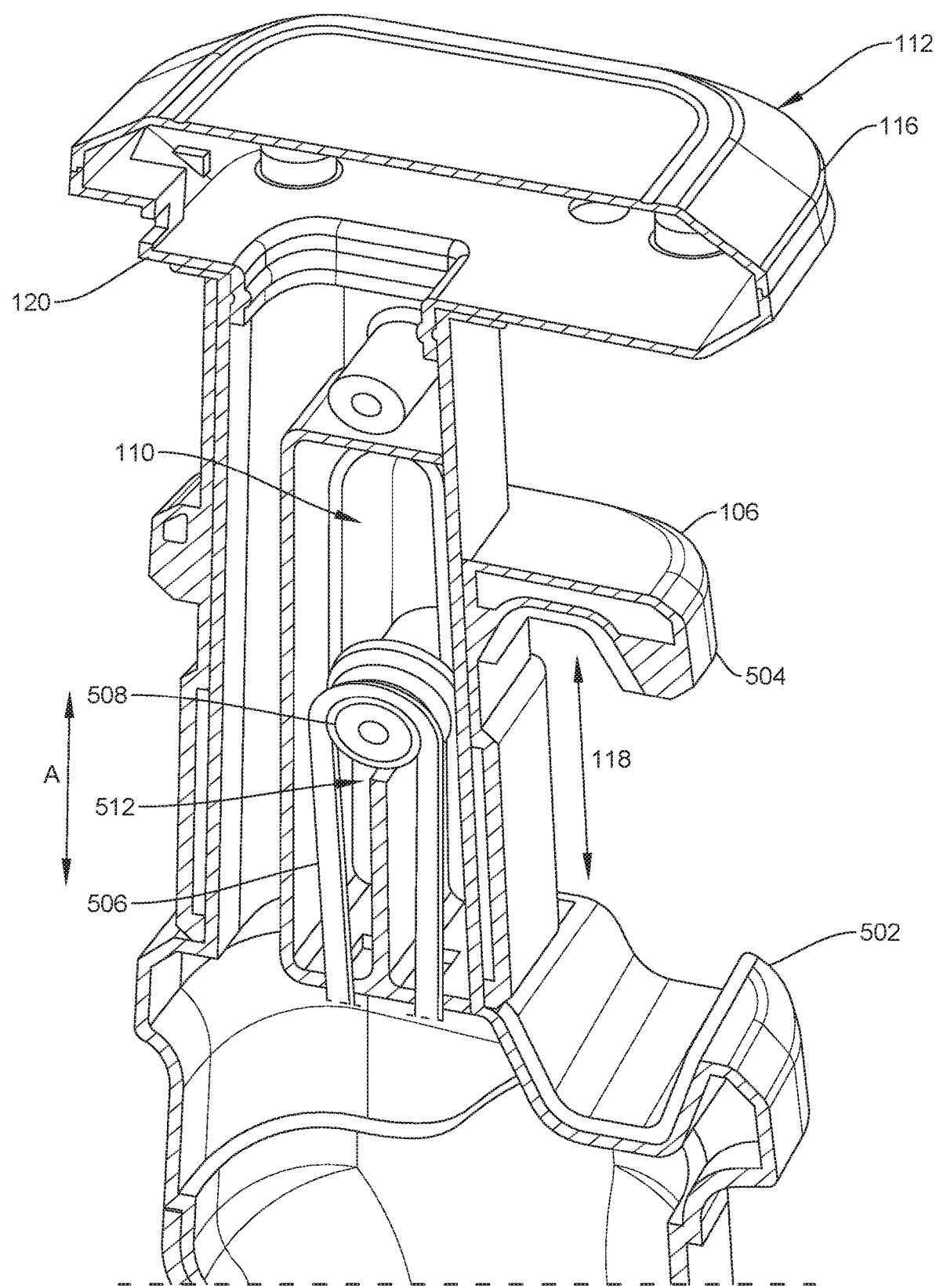

Referring now to FIGS. 4-5B, apparatus 100 comprises a first end 502 affixed to shaft 104 and a second end 504 affixed to clamping mechanism 106 cooperating to define interior space 118 shaped and sized to be occupied by computing device 302. The size of interior space 118 is dependent upon the configuration associated with sliding traction mechanism 110. In one embodiment, sliding traction mechanism 110 comprises a high-performance elastic band 506 configured to interact with a knob 508 configured to traverse a track or rail 512. In one embodiment, knob 508 supports vertical movement along track 512 (as illustrated by line A) based upon the configuration of high-performance elastic band 506 which is configured to lengthen and shorten based upon the desired size for interior space 118. The desired size is based upon the dimensions of computing device 302; thus, allowing apparatus 100 to support retention of a full range of lengths and widths. In one embodiment, sliding traction mechanism 110 supports an active configuration in which high-performance elastic band 506 provides a downward retention force on knob 508 resulting in knob 508 moving down track 512 and second end 504 moving downward until coming into direct contact with a surface on computing device 302. The combination of the downward retention force being applied by high-performance elastic band 506 to knob 508 and second end 504 in addition to the stationary stability provided by first end 502 allows a first surface and second surface located on opposing ends of computing device 302 to come into direct contact with the v-grooves associated with respective ends 108. This allows first end 502 and second end 504 to firmly grip and securely retain computing device 302 making computing device 302 unmovable from interior space 118 and resistant to movement that would otherwise be caused by interactions from the user such as touching and tapping on the user interface of computing device 302. In one embodiment, in order for computing device 302 to be removed from interior space 118, the user must apply an upward force to clamping mechanism 106 resulting in knob 508 traversing up track 512 resulting in high-performance elastic band 506 extending while still applying the downward retention force and interior space 118 becoming larger. Once interior space 118 is larger than the dimensions of computing device 302 (from one opposing surface of the computing device to the other), computing device 302 may be removed by the user.

Referring now to FIG. 6, a method 600 for retaining a mobile device during data collection and field mapping procedures via apparatus 100 is depicted. In step 602, the user positions computing device 302 into interior space 118 by placing a first surface of computing device 302 into contact with first end 502 allowing the first surface to be tightly wedged by the one or more v-grooves associated with first end 502. Depending upon the size of computing device 302, interior space 118 may be too big or too small to effectively and securely retain computing device 302 at the given moment in which the user adjusts the size of interior space 118 via upward or downward movement of second end 504, allowed by sliding traction mechanism 110, until second end 504 comes into contact with a second surface of computing device 302 that is opposing the first surface. In step 604, the one or more v-grooves associated with second end 504 come into direct contact with the second surface and the retention force applied by high-performance elastic band 506 securely and firmly holds computing device 302 in a stationary manner within interior space 118. In step 606, the user has full operational functionality of computing device 302 while it is retained within interior space 118; however, in one embodiment, computing device 302 may receive a transmission or request to connect to the GNSS processor and associated antenna housed in the domed housing. The successful pairing of computing device 302 to the GNSS processor allows the enhanced components associated with the GNSS processor, such as the associated antenna, to be integrated into computing device 302. For example, GNSS receiver antennas of commercially available mobile devices and tablets are generally not configured to detect and identify entities outside of a predetermined range. This limitation especially prevents detection and identification of subterranean components; thus, the combination of inherent GNSS functionality of computing device 302 with the integration of the GNSS processor allows subterranean components, such as public utility mains, to be identified. In step 208, the GNSS processor boosts a plurality of positioning data associated with computing device 302. In application, the user grips base element 102 and traverses the excavation site allowing a GNSS receiver associated with GNSS processor to receive positioning data respective to computing device 302 based on the direction and orientation of domed housing 112. In one embodiment, the collected positioning data may be enhanced positioning data based on integration of GNSS processor, and the positioning data may be used to generate 3-dimensional topographic maps of the excavation site reflecting components and entities above the surface along with entities beneath the surface such as public utility mains.

FIG. 7 is a block diagram of a system including an example computing device 700 and other computing devices. Consistent with the embodiments described herein, the aforementioned actions performed by the mobile device may be implemented in a computing device 700, such as the computing device 302 of FIG. 3. Any suitable combination of hardware, software, or firmware may be used to implement the computing device 302. The aforementioned system, device, and processors are examples and other systems, devices, and processors may comprise the aforementioned computing device. Furthermore, computing device 700 may comprise an operating environment for process 600, as described above. Process 600 may operate in other environments and are not limited to computing device 700.

With reference to FIG. 7, a system consistent with an embodiment may include a plurality of computing devices, such as computing device 700. In a basic configuration, computing device 700 may include at least one processing unit 702 and a system memory 704. Depending on the configuration and type of computing device, system memory 704 may comprise, but is not limited to, volatile (e.g. random-access memory (RAM)), non-volatile (e.g. read-only memory (ROM)), flash memory, or any combination or memory. System memory 704 may include operating system 705, and one or more programming modules 706. Operating system 705, for example, may be suitable for controlling computing device 700's operation. In one embodiment, programming modules 706 may include, for example, a program module 707 for executing the actions of device 302. Furthermore, embodiments may be practiced in conjunction with a graphics library, other operating systems, or any other application program and is not limited to any particular application or system. This basic configuration is illustrated in FIG. 7 by those components within a dashed line 720.

Computing device 700 may have additional features or functionality. For example, computing device 700 may also include additional data storage devices (removable and/or non-removable) such as, for example, magnetic disks, optical disks, or tape. Such additional storage is illustrated in FIG. 7 by a removable storage 709 and a non-removable storage 710. Computer storage media may include volatile and nonvolatile, removable and non-removable media implemented in any method or technology for storage of information, such as computer readable instructions, data structures, program modules, or other data. System memory 704, removable storage 709, and non-removable storage 710 are all computer storage media examples (i.e. memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 700. Any such computer storage media may be part of device 700. Computing device 700 may also have input device(s) 712 such as a keyboard, a mouse, a pen, a sound input device, a camera, a touch input device, etc. Output device(s) 714 such as a display, speakers, a printer, etc. may also be included. Computing device 700 may also include a vibration device capable of initiating a vibration in the device on command, such as a mechanical vibrator or a vibrating alert motor. The aforementioned devices are only examples, and other devices may be added or substituted.

Computing device 700 may also contain a network connection device 715 that may allow device 700 to communicate with other computing devices 718, such as over a network in a distributed computing environment, for example, an intranet or the Internet. Device 715 may be a wired or wireless network interface controller, a network interface card, a network interface device, a network adapter or a LAN adapter. Device 715 allows for a communication connection 716 for communicating with other computing devices 718. Communication connection 716 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both computer storage media and communication media.

As stated above, a number of program modules and data files may be stored in system memory 704, including operating system 705. While executing on processing unit 702, programming modules 706 (e.g. program module 707) may perform processes including, for example, one or more of the stages of the process 600 as described above. The aforementioned processes are examples, and processing unit 702 may perform other processes. Other programming modules that may be used in accordance with embodiments herein may include electronic mail and contacts applications, word processing applications, spreadsheet applications, database applications, slide presentation applications, drawing or computer-aided application programs, etc.

Generally, consistent with embodiments herein, program modules may include routines, programs, components, data structures, and other types of structures that may perform particular tasks or that may implement particular abstract data types. Moreover, embodiments herein may be practiced with other computer system configurations, including handheld devices, multiprocessor systems, microprocessor-based or programmable consumer electronics, minicomputers, mainframe computers, and the like. Embodiments herein may also be practiced in distributed computing environments where tasks are performed by remote processing devices that are linked through a communications network. In a distributed computing environment, program modules may be located in both local and remote memory storage devices.

Furthermore, embodiments herein may be practiced in an electrical circuit comprising discrete electronic elements, packaged or integrated electronic chips containing logic gates, a circuit utilizing a microprocessor, or on a single chip (such as a System on Chip) containing electronic elements or microprocessors. Embodiments herein may also be practiced using other technologies capable of performing logical operations such as, for example, AND, OR, and NOT, including but not limited to mechanical, optical, fluidic, and quantum technologies. In addition, embodiments herein may be practiced within a general-purpose computer or in any other circuits or systems.

Embodiments herein, for example, are described above with reference to block diagrams and/or operational illustrations of methods, systems, and computer program products according to said embodiments. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments have been described, other embodiments may exist. Furthermore, although embodiments herein have been described as being associated with data stored in memory and other storage mediums, data can also be stored on or read from other types of computer-readable media, such as secondary storage devices, like hard disks, floppy disks, or a CD-ROM, or other forms of RAM or ROM. Further, the disclosed methods' stages may be modified in any manner, including by reordering stages and/or inserting or deleting stages, without departing from the claimed subject matter.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. An apparatus for retaining a mobile computing device during data collection and field mapping procedures, wherein the apparatus comprises:

a base element configured to be gripped by a user;
a shaft that projects outwardly from, and is slidably coupled with, the base element, the shaft comprising a sliding traction mechanism that provides an adjustable length of said shaft
a clamping mechanism comprising a first retaining element affixed to the base element and a second retaining element affixed to the shaft, wherein the first retaining element and second retaining element cooperate to define an interior space sized for retention of the mobile computing device; and
a domed housing affixed to a top of the shaft, the domed housing configured to house an antenna and a global navigation satellite system (GNSS) processor configured to be communicatively coupled to the mobile computing device.

2. The apparatus of claim 1, wherein the base element comprises a panel configured to support gripping of the base element providing handle functionality.

3. The apparatus of claim 2, wherein the panel comprises at least one of rubber, polymer, silicone, nitrile, vinyl, neoprene and any combination thereof.

4. The apparatus of claim 1, wherein the sliding traction mechanism comprises a high-performance elastic band disposed internally configured to support adjustment of the interior space based on the size of the mobile computing device.

5. The apparatus of claim 1, the apparatus further comprising an active configuration wherein the second retaining element in cooperation with the sliding traction mechanism provides a retention force retaining the mobile computing device between the first retaining element and the second retaining element.

6. The apparatus of claim 1, wherein the base element is affixed to a first end of the shaft and the domed housing is affixed to a second end of the shaft.

7. The apparatus of claim 1, wherein the domed housing comprises a top lid and a bottom lid configured to integrate forming an internal space configured for housing the GNSS processor.

8. The apparatus of claim 1, wherein the first retaining element comprises at least a first v-groove and the second retaining element comprises a second v-groove, the first and second v-grooves configured to be in direct contact with the mobile computing device.

9. The apparatus of claim 1, wherein the mobile computing device and the GNSS processor are configured to collect a plurality of geographic location data associated with a proposed excavation site comprising at least one buried asset.

10. A method for retaining a mobile computing device during data collection and field mapping procedures, the method comprising:

providing an apparatus comprising a base element configured to be gripped by a user, a shaft that projects outwardly from, and is slidably coupled with, the base element, the shaft comprising a sliding traction mechanism that provides an adjustable length of said shaft, a clamping mechanism comprising a first retaining element affixed to the base element and a second retaining element affixed to the shaft, wherein the first retaining element and the second retaining element cooperate to define an interior space sized for retention of the mobile computing device, and a domed housing affixed to a top of the shaft, the domed housing configured to house an antenna and a global navigation satellite system (GNSS) processor configured to be communicatively coupled to the mobile computing device;

positioning the mobile computing device in the interior space defined by cooperation between the first retaining element and the second retaining element;

applying a retention force associated with the sliding traction mechanism, thereby allowing the mobile computing device to be retained in the interior space; and communicatively coupling the mobile computing device to the antenna and the GNSS processor housed in the domed housing.

11. The method of claim 10, further comprising collecting a plurality of geographic location data via the mobile computing device and the GNSS processor.

12. The method of claim 11, wherein the plurality of geographic location data is associated with a proposed excavation site comprising at least one buried asset.

13. The method of claim 10, wherein the second retaining element in cooperation with the sliding traction mechanism provides the retention force retaining the mobile computing device between the first retaining element and the second retaining element.

14. The method of claim 10, wherein the base element is affixed to a first end of the shaft and the domed housing is affixed to a second end of the shaft.

15. The method of claim 10, wherein the first retaining element comprises at least a first v-groove and the second retaining element comprises a second v-groove, the first and second v-grooves configured to be in direct contact with the mobile computing device.

* * * * *